United States Patent
Lin et al.

(10) Patent No.: US 9,825,169 B2
(45) Date of Patent: Nov. 21, 2017

(54) PARTIAL, SELF-BIASED ISOLATION IN SEMICONDUCTOR DEVICES

(71) Applicant: Freescale Semiconductor, Inc., Austin, TX (US)

(72) Inventors: Xin Lin, Phoenix, AZ (US); Xu Cheng, Chandler, AZ (US); Hongning Yang, Chandler, AZ (US); Zhihong Zhang, Chandler, AZ (US); Jiang-Kai Zuo, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/971,896

(22) Filed: Dec. 16, 2015

(65) Prior Publication Data

US 2017/0179279 A1 Jun. 22, 2017

(51) Int. Cl.
| | | |
|---|---|---|
| *H01L 29/78* | (2006.01) | |
| *H01L 29/06* | (2006.01) | |
| *H01L 29/10* | (2006.01) | |
| *H01L 29/08* | (2006.01) | |
| *H01L 21/761* | (2006.01) | |
| *H01L 21/265* | (2006.01) | |
| *H01L 29/66* | (2006.01) | |

(52) U.S. Cl.
CPC .... *H01L 29/7823* (2013.01); *H01L 21/26513* (2013.01); *H01L 21/761* (2013.01); *H01L 29/063* (2013.01); *H01L 29/0646* (2013.01); *H01L 29/0882* (2013.01); *H01L 29/1095* (2013.01); *H01L 29/66681* (2013.01)

(58) Field of Classification Search
None
See application file for complete search history.

(56) References Cited

U.S. PATENT DOCUMENTS

| | | | | |
|---|---|---|---|---|
| 4,868,921 A | * | 9/1989 | Adler | H01L 29/0878 |
| | | | | 257/488 |
| 6,882,023 B2 | | 4/2005 | Khemka et al. | |
| 8,541,862 B2 | | 9/2013 | Yang et al. | |
| 8,652,930 B2 | | 2/2014 | Yang et al. | |
| 9,214,542 B2 | * | 12/2015 | Chen | H01L 29/66659 |
| 2002/0024071 A1 | * | 2/2002 | Kawajiri | H01L 27/14609 |
| | | | | 257/292 |
| 2008/0315266 A1 | * | 12/2008 | Eshun | H01L 27/0617 |
| | | | | 257/285 |
| 2013/0270606 A1 | * | 10/2013 | Chen | H01L 29/7835 |
| | | | | 257/183 |
| 2015/0270333 A1 | * | 9/2015 | Yang | H01L 29/063 |
| | | | | 257/337 |
| 2017/0077295 A1 | | 3/2017 | Yang | |

* cited by examiner

*Primary Examiner* — Lex Malsawma

(57) ABSTRACT

A device includes a semiconductor substrate, a buried doped isolation layer disposed in the semiconductor substrate to isolate the device, a drain region disposed in the semiconductor substrate and to which a voltage is applied during operation, and a depletion region disposed in the semiconductor substrate and having a conductivity type in common with the buried doped isolation barrier and the drain region. The depletion region reaches a depth in the semiconductor substrate to be in contact with the buried doped isolation layer. The depletion region establishes an electrical link between the buried doped isolation layer and the drain region such that the buried doped isolation layer is biased at a voltage level lower than the voltage applied to the drain region.

20 Claims, 3 Drawing Sheets

PARTIAL, SELF-BIASED ISOLATION IN SEMICONDUCTOR DEVICES

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor (MOS) field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices are designed to prevent a direct forward bias or punch-through path from a body region of the LDMOS device to an underlying substrate.

LDMOS devices are often used in applications, such as automotive applications, involving operational voltages greater than 40 volts. Breakdown resulting from applying such high voltages to the drain is often prevented through a reduced surface field (RESURF) structure in the LDMOS device design. The RESURF structure is designed to deplete the drift space of the LDMOS device in both vertical and lateral directions, thereby reducing the electric field near the surface at the drift region and thus raising the off-state breakdown voltage (BVdss) of the device.

Some LDMOS devices have a "double RESURF" structure. For example, in n-channel LDMOS devices, the drift space contains an upper level n-type region and a lower level p-type region, with an n-type buried isolation layer beneath the p-type region. The double nature of the structure refers to the depletion of the two regions and the reduction of the electric field in the related junction areas. Double RESURF structures typically apply the drain voltage to isolation regions in order to deplete both the n-type and p-type regions.

However, biasing the isolation regions at the drain voltage increases the field stress between the body of the LDMOS device and a buried isolation layer. Breakdown may instead occur between the body and the buried isolation layer, thereby limiting the breakdown voltage. Previous efforts to address such source/body-based breakdown have introduced fabrication challenges or degraded the electrostatic discharge (ESD) and safe operating area (SOA) performance of the device.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Embodiments of laterally diffused metal oxide semiconductor (LDMOS) and other power transistor devices and electronic apparatus with self-biased isolation are described, along with methods of fabricating such devices and apparatus. Isolation regions may be partially lifted to a bias voltage level using a well region that couples the isolation regions to a bias voltage applied to a drain region. The well region is positioned and otherwise configured to be depleted of charge carriers. As a result, some of the bias voltage applied to the drain region is sustained across the depleted well region. Only a portion of the bias voltage is therefore passed on to the isolation regions. The depleted well region thus provides partial biasing, or lifting, of the isolation potential.

The self-biasing and partial lifting of the isolation potential avoids biasing the isolation regions at voltage levels that would otherwise establish the breakdown voltage level of the device. With significantly less voltage stress between the device body and the isolation regions, much higher breakdown voltage levels (e.g., BVDSS levels) may be achieved.

The depleted well region establishes an electrical link between the drain region and a buried doped isolation layer of a doped isolation barrier. The electrical link may be primarily vertically oriented. For instance, the depleted well region may extend from an accumulation region or a certain part of a drift region of the device to reach the buried doped isolation layer. With a vertical link, the overall device size may not increase. Performance parameters related to device size, such as resistance, are thus not adversely affected.

The depleted well region also protects a deep trench isolation (DTI) region along the device periphery. The depleted well region partially biases the isolation regions adjacent the DTI region. As a result, additional breakdown protection for the DTI region is naturally provided. The protection is provided without increasing device footprint.

The depleted well region may be formed using an implant directed to forming a drift region of another field effect transistor device. Use of a pre-existing implant avoids an increase in fabrication costs.

Figure 1:
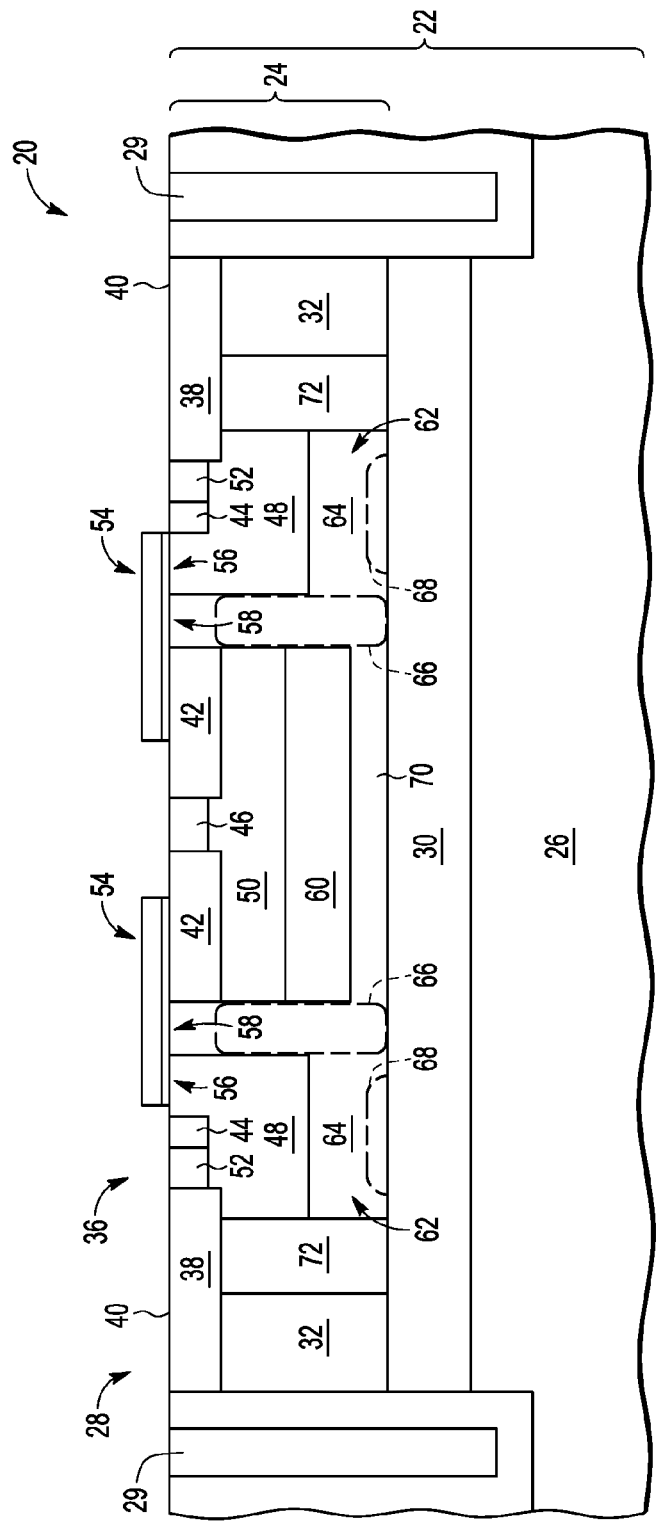
FIG. 1 is a cross-sectional, schematic view of an exemplary n-channel LDMOS (or NLDMOS) transistor with self-biased isolation in accordance with one embodiment.

FIG. 1 is a schematic cross-sectional view of an example of an LDMOS device 20 constructed in accordance with one embodiment. In this embodiment, the device 20 is configured as an n-channel device. The device 20 may be configured as a RESURF transistor. In this example, the device 20 has a double RESURF arrangement.

The device 20 includes a semiconductor substrate 22, which may, in turn, include a number of epitaxial layers 24. In this example, the semiconductor substrate 22 includes a single p-type epitaxial layer 24 grown on an original, bulk substrate 26. The original substrate 26 may be a heavily doped p-type substrate in some cases, such as those having multiple epitaxial layers. The substrate 22 may be biased by a substrate contact region (not shown). The device 20 may alternatively or additionally include non-epitaxial layers in which one or more device regions are formed.

Any one or more of the layers of the semiconductor substrate 22 may include silicon. Alternative or additional semiconductor materials may be used in other embodiments. The structural, material, and other characteristics of the semiconductor substrate 22 may vary from the example shown. Although useful for increasing the breakdown voltage in connection with bulk substrates, the disclosed embodiments are not limited to bulk substrates. For example, the semiconductor substrate 22 may be or include a silicon-on-insulator (SOI) substrate. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 28 of the device 20 is depicted in FIG. 1. In this case, the device area 28 has two mirrored sides. For example, the device 20 may be laterally symmetrical about a central region, e.g., a body region, as described below. In other cases, the device 20 is also symmetrical in the other lateral direction. In still other cases, the device 20 is not laterally symmetrical. For example, the device area 20 may correspond with only one side of the device area 20 shown in FIG. 1.

The device area 28 may be defined by one or more device isolating layers or other regions in the semiconductor substrate 22 (e.g., the epitaxial layer 24). The regions may be or include doped semiconductor regions and/or undoped (e.g., dielectric) regions. In this example, the device area 28 is defined by a deep-trench isolation (DTI) ring 29. The structures in the device area 28 are laterally isolated from a remainder of the substrate 22 by the deep-trench isolation (DTI) ring 29. In other cases, the device 20 does not include the DTI ring 29.

A doped isolation barrier is provided for further isolation of the device 20. The doped isolation barrier may be disposed along the periphery of the device area 28. The doped isolation barrier may include a number of doped isolation layers and regions provided within the DTI ring 29 along the periphery of the device area 28. The layers and regions of the doped isolation barrier may laterally and/or otherwise surround the remainder of the device area 28 for further isolation of the device 20. For instance, the regions or layers of the doped isolation barrier may form an isolation tub in which the active components of the device 20 are disposed. The isolation tub includes a bottom and sidewalls extending upward from the bottom. In this example, the doped isolation barrier includes a buried isolation layer 30 that defines a bottom of the isolation tub. The doped isolation barrier also includes one or more ring-shaped isolation wells 32 that define sidewalls of the isolation tub. The isolation wells 32 may be stacked upon one another. The isolation well(s) 32 is/are in contact with the buried isolation layer 30 to electrically connect the doped isolation barrier for the device 20. In other cases, any number of wells may be used to define the sidewalls. In this example, with a p-type substrate, the regions and layers of the doped isolation barrier are n-type regions.

Within the doped isolation barrier is a core device area 36 of the device 20. The core device area 36 may correspond with the active area of the device 20, i.e., the subset of the device area 28 in which the active components of the device 20 are disposed. In the symmetrical example of FIG. 1, the core device area 36 corresponds with the area extending from an outer terminal (e.g., a body contact as described below) inward. The buried isolation layer 30 extends across the entire lateral extent of the core device area 36. The lateral extent of the core device area 36 is defined in this example by an isolation region 38 disposed along a surface 40 of the substrate 22. The isolation region 38 extends laterally inward from the DTI region 29. In this case, the isolation region 38 is a shallow trench isolation (STI) region. The isolation region 38 may thus be ring-shaped to laterally surround the core device area 36.

The device 20 may include a number of other isolation regions (e.g., STI regions) to further define the active areas of the device 20. In this example, the device 20 includes a field isolation region 42 that establishes the length of the drift portion of the conduction path of the device. Additional or alternative isolation regions may be included. In other cases, the device 20 includes fewer isolation regions. For example, the device 20 may be configured with an active drift arrangement.

The buried isolation layer 30 may be formed in the semiconductor substrate 22 before the growth of the epitaxial layer 24 thereof. The buried isolation layer 30 may thus extend laterally across and under the regions disposed, and later formed, in the core device area 36. Alternatively or additionally, some or all of the buried isolation layer 30 is formed in the epitaxial layer(s) 24. The buried isolation layer 30 may assist in depletion of a p-type region 60 underneath a drift region of the device 20 to support the double RESURF effect, as described below.

One or more of the layers and regions of the doped isolation barrier may have a dopant concentration level and/or be otherwise configured for high voltage (HV) operation (e.g., high side operation in which the terminals of the device 20 are level shifted relative to the semiconductor substrate 22, which may be grounded). For example, the higher dopant concentration level of the isolation barrier layer may be useful in preventing punch-through. Any number of the device isolation wells, sinks, or buried layers may or may not be connected to one another. Additional, fewer, or alternative device isolation layers or regions may be provided in the semiconductor substrate 22.

Within the core device area 36, the device 20 includes a source region 44, a drain region 46, a body region 48 in which the source region 44 is disposed, and a drift region 50 in which the drain region 46 is disposed. In this example, the body region 48 is a p-type well formed in the epitaxial layer 24 of the substrate 22. The body region 48 may be biased via one or more heavily doped p-type body contact regions or electrodes 52 formed in or otherwise above the p-type well of the body region 48 in the semiconductor substrate 22. The dopant concentration of each contact region 52 may be at a level sufficient to establish an ohmic contact to the body region 48.

The source and drain regions 44 and 46 are laterally spaced from one another in the lateral dimension shown in the cross-section of FIG. 1. In the symmetrical example of FIG. 1, the source region 44 surrounds a centrally disposed drain region 46. Any number of source or drain regions 44, 46 may be provided in various arrangements. In this example, the source and drain regions 44 and 46 are heavily doped n-type portions of the epitaxial layer 24. The heavily doped n-type source region 44 is disposed within, on, and/or otherwise above the body region 48. The heavily n-type doped drain region 46 is spaced from the body region 48 along the lateral dimension shown in FIG. 1. Such spacing defines a conduction path of the device between the source and drain regions 44 and 46. The regions 44, 46, or a portion thereof, may have a dopant concentration at a level sufficient to establish ohmic contacts for biasing the drain region 46 and the source region 44. In this n-channel LDMOS configuration, the drain region 46 is biased at a drain-source voltage, Vds, relative to the source region 44.

The device 20 includes one or more gate structures 54 formed on or above the surface 40 of the semiconductor substrate 22. In the example of FIG. 1, the device 20 may include a pair of gate structures 54, or a single ring-shaped gate structure 54. The regions in the core device area 36 may also be ring-shaped (with the exception of those positioned in the center, such as the drain and drift regions 46, 50). In these and other cases, the core device area 36 may have a rectangular layout. The gate structure 54 is disposed between the source region 44 and the drain region 46. The gate structure 54 includes a polysilicon or other conductive plate located on or above a gate dielectric. For example, the gate dielectric may include silicon dioxide (or oxide) deposited or otherwise formed on the surface 40.

The gate structure 54 may include one or more dielectric sidewall spacers disposed along lateral edges of the gate structure 54. The sidewall spacers may cover the lateral edges to act as a silicide blocker to prevent a silicide short along the surface of the substrate 22. The sidewall spacers may provide spacing to separate the conductive components of the gate structure 54 from the source region 44 and other regions or structures within the core device area 36. In this example, one of the sidewall spacers is used for alignment purposes in defining an edge of the source region 44.

In the example of FIG. 1, the device 20 is laterally symmetrical about the drain region 46. The drain region 46 may be centered or otherwise internally disposed within the core device area 36. In this case, the source and body regions 44, 48 are ring-shaped regions that laterally surround the drain and drift regions 46, 50. The gate structure 54 may thus also surround the drain and drift regions 46, 50. In other cases, the device 20 may include a centrally disposed or inner body region. In still other cases, the drain region 46 may not be centered or otherwise disposed inward of, or laterally surrounded by, the source region 44 as shown. For instance, in non-symmetrical layouts, the source and body regions 44, 48 are not ring-shaped. For example, the source region 44 may have a rectangular layout.

The configuration of the gate structure 54 may vary. For example, the gate structure 54 may be arranged in a dual gate finger configuration in which two transistors are symmetrically arranged to share the same drain region 46. The configuration of the gate structure 54 may include multiple conductive layers (e.g., polysilicon plates). The components, materials, and other characteristics of the gate structure 54 may vary from the example shown.

The STI region(s) 42 are disposed between the gate structure 54 and the drain region 46 to protect the gate structure 54 from the high voltage applied to the drain region 46. For example, the STI region 42 may be configured to prevent or minimize hot carrier injection (HCI) into the oxide layer of the gate structure 54. The STI region 42 is disposed in the drift region 50 to form a field drift structure. The other STI region(s) 38 define active areas along the periphery of the core device area 36.

A number of other shallow trench isolation (STI) regions may be formed at the surface 40 in the semiconductor substrate 22. For example, an additional STI region may be disposed between the body contact region 52 and the source region 44. Additional, fewer, or alternative STI regions may be disposed in the semiconductor substrate 22 to isolate or separate various contact regions, as well as other regions within the device area 28 of the device 20.

The core device area 36 may vary from the example shown in FIG. 1. For example, the conduction path of the device 20 may be configured with one or more lightly or intermediately doped transition regions (e.g., n-type lightly doped drain, or NLDD, regions) at or near the source and drain regions 44 and 46. Each transition region may be or include a diffused region formed in connection with the source or drain region 44, 46. Such transition regions may couple the source region 44 to a channel region 56 (described below). In one example, the device 20 includes an NLDD region adjacent the source region 44. The NLDD region may extend laterally under the gate structure 54.

When the gate structure 54 is biased, charge carriers (in this case, electrons; alternatively, holes) accumulate in one or more channel areas or regions 56. Each channel region 56 (or a portion thereof) may be formed in the body region 48 under the gate structure 54. In this example, the accumulation of electrons results in a charge inversion in the channel region 56 from the p-type of the body region 48 to an n-type conduction layer or area near the surface 40 of the semiconductor substrate 22. Once a sufficient amount of the charge carriers accumulate in the conduction layer or area, charge carriers are capable of flowing from the source region 44 toward the drain region 46 through the channel region 56.

The channel region 56 may include other regions or areas in the semiconductor substrate 22 in which charge inversion or accumulation occurs as a result of the bias applied to the gate structure 54. Charge carriers may also accumulate outside of or beyond the body region 48. For example, charge carriers may accumulate in a region of the epitaxial layer 24 between the body region 48 and the drift region 50, as well as in an accumulation region 58 or portion of the drift region 50 near the surface 40 under the gate structure 54.

After exiting the channel region 56, the charge carriers drift through the accumulation region 58 and the drift region 50 to reach the drain region 46. The drift region 50 electrically couples the drain region 46 and the channel region 56. The drift region 50 may be configured to allow the charge carriers to drift under the electric field established by the drain-source voltage applied between the drain region 46 and the source region 44. In this example, the drift region 50 is an n-type well that laterally extends under the STI region 42 as a field drift region.

The drift region 50 may be configured to be depleted to reduce the magnitude of the electric field in areas in and/or around the drift region 50 via the reduced surface field (RESURF) effect to increase the voltage at which breakdown occurs along the conduction path of the device 20. In this example, the drift region 50 is depleted both laterally and vertically. A junction forms between (i) the n-type well(s) of the accumulation region 58 and the drift region 50 and (ii) the p-type epitaxial layer 24 and/or the body region 48 to establish a lateral RESURF effect. The junction is reverse-biased as a result of the application of a bias voltage Vds to the drain region 46, e.g., between the source and body regions 44, 48 and the drain region 46. The drift region 50 is also depleted vertically by a p-type buried well region 60 disposed under the drift region 50. The buried well region 60 is floating. The depletion of the drift region 50 allows a portion of the bias voltage to be disposed across the drift region 50, thereby lowering the likelihood of breakdown and/or other problems near the channel region 56.

Protection against breakdown at or near the periphery of the device area 28 is provided through biasing of the doped isolation barrier. Biasing the doped isolation barrier helps to isolate the device 20 from the remainder of the substrate 22. However, the buried isolation layer 30 and other components of the doped isolation barrier are biased at a voltage level lower than the drain-source bias voltage. The full drain-source bias voltage is not directly applied to the doped isolation barrier. Instead, the potential of the doped isolation barrier is instead partially lifted to the voltage level of the drain-source bias voltage to lower the voltage stress between the body region 48 and the doped isolation barrier (e.g., the buried isolation layer 30).

Such partial biasing of the doped isolation barrier is provided by a depletion region 62 disposed in the semiconductor substrate 22. The depletion region 62 electrically couples the drain region 46 and the doped isolation barrier. A voltage drop develops across the depletion region 62 because the depletion region 62 is depleted of charge carriers. With a portion of the drain-source bias voltage is supported by the depletion region 62, only part of the bias voltage reaches the doped isolation barrier. The doped isolation barrier is thus not electrically tied to the drain region 46. The doped isolation barrier is instead biased at a voltage level lower than the voltage applied to the drain region 46.

The depletion region 62 is positioned and configured to establish an electrical link between the buried doped isolation layer 30 and the drain region 46 such that the buried doped isolation layer 30 is biased at a voltage level lower than the voltage applied to the drain region 46. The depletion region 62 reaches a depth in the semiconductor substrate 22 to be in contact with the buried doped isolation layer 30. The depletion region 62 has a conductivity type in common with the buried doped isolation layer 30 and other regions of the buried doped isolation barrier and the drain region 46. In this case, the depletion region 62 has n-type conductivity.

The depletion region 62 may be a composite region disposed within the core device area 36. The depletion region 62 may include any number of wells or other regions disposed in various arrangements and formed via any number of implants or other doping procedures. In the example of FIG. 1, the depletion region 62 includes the drift region 50 and a depleted well region 64. In this example, the depleted well region 64 is an n-type well positioned between, and in contact with, the drift region 50 and the buried doped isolation layer 30. The depleted well region 64 may be formed from one or more implants configured such that the depleted well region 64 extends from the drift region 50 to reach the buried doped isolation layer 30.

The depleted well region 64 is depleted via its proximity to one or more regions of opposite conductivity type. In this example, the depleted well region 64 is in contact with the buried well region 60 and the body region 48. One portion of the depleted well region 64 are positioned in between the buried well region 60 and the body region 48. In this case, the buried well region 60 is laterally surrounded by the depleted well region 64. Another portion of the depleted well region 64 extends laterally outward from the buried well region 60 and under the body region 48.

The depleted well region 64 may be disposed at, and extend downward from, the surface 40 of the substrate 22. The accumulation region 58 may be formed in the depleted well region 64. As shown in the example of FIG. 1, the depleted well region 64 may extend downward from the area in which the accumulation region 58 is formed.

The depleted well region 64 may be formed separately or in conjunction with the drift region 50. The depleted well region 64 may be a lightly doped well region. For instance, the depleted well region 64 may have a dopant concentration level slightly above the p-type dopant concentration level of the epitaxial layer 24 in which the region 64 is formed. The depleted well region 64 and the drift region 50 may be formed by a single implant or multiple implants. In the latter case, as shown in FIG. 1, the drift region 50 may have a different (e.g., higher) dopant concentration level than the depleted well region 64. A higher dopant concentration level establishes a lower on-resistance for the device 20. The lower dopant concentration level of the depleted well region 64 allows the depleted well region 64 to be more easily depleted of charge carriers. The single well arrangement of the former case (FIG. 2) establishes a common dopant concentration profile for the drift region 50 and the depleted well region 64.

In the example of FIG. 1, the depleted well region 64 includes a link section or portion 66 disposed laterally between the drift region 50 and the body region 48. The link portion 66 extends vertically to connect the drift region 50 and the buried doped isolation layer 30. The link section 66 establishes the electrical link that partially biases the doped isolation barrier. In the example of FIG. 1, the link portion 66 is a vertically oriented section of the depleted well region 64. An upper end of the link portion 66 is in contact with, and disposed laterally between, the body region 48 and the drift region 50. A lower end of the link portion 66 is in contact with, and reaches the depth of, the buried doped isolation layer 30. In between the upper and lower ends, the link portion 66 vertically extends past the body region 48 and/or the buried doped well 60.

The depletion region 62 may be fully or partially depleted of charge carriers. In the example of FIG. 1, one or more sections or portions of the depletion region 62 may not be entirely or fully devoid of charge carriers. For example, a section or portion 68 of the depletion region 62 sufficiently spaced from the oppositely doped region(s) (e.g., the body region 48) may not be fully depleted. Alternative or additional portions may also be partially depleted. In these and other cases, the depletion region 62 (or depleted well region 64) is nonetheless referred to as depleted because the link portion 66 of the depletion region 62 is substantially or sufficiently depleted of charge carriers to establish the electrical link between the drain region 46 and the buried doped barrier layer 30. Thus, the terms "depleted" and "depletion" are used herein to denote an effective lack of charge carriers.

The extent of the voltage drop across the depleted well region 64 may vary in accordance with the extent to which the depletion region 62 (e.g., the depleted well region 64) is depleted of charge carriers. The depleted well region 64 may be partially or fully depleted of charge carriers. The extent to which the depleted well region 64 is depleted of charge carriers may be enhanced by one or more regions, structures, and/or other characteristics located in or near the core device area 36. The extent of the depletion may be enhanced both laterally and/or vertically.

Depletion is accomplished in the lateral direction in the example of FIG. 1 through the presence of the body region 48, the buried well region 60, and a portion 70 of the epitaxial layer 24 between the buried well region 60 and the buried doped isolation layer 30. The epitaxial layer portion 70 has a dopant concentration level lower than the buried well region 60.

The depletion region 62 may not be fully depleted of charge carriers when the drain bias voltage is low. The lack of full depletion may extend beyond the portion 68. In some cases or circumstances (e.g., an extremely low drain bias voltage), for instance, the entire depletion region 62 is not fully depleted. During these conditions, the potential of the buried doped isolation layer 30 follows the drain bias voltage until at least a portion of the depletion region 62 is fully depleted. At that point, a certain voltage drop is observed between the drain region 46 and the buried doped isolation layer 30. Thus, depending on the operating conditions, the buried doped isolation layer may be biased at a voltage level equal to, or lower than, the drain bias voltage. The depletion region 62 is nonetheless still referred to as a depletion region herein despite the possibility for such variance in operating conditions.

The buried well region 60 is spaced from the buried doped isolation layer 30 by a portion of the semiconductor substrate 22 having the same conductivity type as the buried well region 60. The substrate portion has a dopant concentration level lower than the buried well region 60. The buried well region 60 may be a floating region having a layout that matches a layout of the drift region 50. The buried well region 60 may be formed via an implant (e.g., a p-type implant) that relies on the same mask as the implant (e.g., an n-type implant) used to form the drift region 50. The buried well region 60 may thus have a layout that corresponds with the drift region 50. In other embodiments, the buried well region 60 has a layout smaller or larger than the drift region 50.

The formation of the above-described regions involved in the partial biasing of the doped isolation barrier may not increase the complexity or cost of fabricating the device 20. For instance, and as described below in connection with the exemplary fabrication process shown in FIG. 3, the implant (s) used to form the depleted well region 64 may be preexisting implants. Furthermore, in the example of FIG. 1, the n-type and p-type implants used to form the drift and buried well regions 50, 60 may be configured with the same mask, insofar as the layout of the n-type and p-type regions may be the same.

The presence of the depleted well region 64 may not result in any increase in device footprint. The periphery of the device area 28 corresponds with the portion of the device area 28 outside of the core device area 36. The size of the periphery may not increase because the depleted well region 64 does not necessitate changes to a peripheral portion 72 of the epitaxial layer 24 that laterally separates the body region 48 from the well(s) 32 of the doped isolation barrier.

The arrangement of the depletion region 62 of the device 20 may instead enable area savings to be realized. As shown in FIG. 1, the biasing of the doped isolation barrier is achieved without having to rely on another contact to provide a voltage to the doped isolation barrier. For instance, the device 20 does not include an isolation contact or isolation contact region. Moreover, the resulting area savings may be significant for some types of devices, such as analog devices, for which the device periphery constitutes a considerable fraction of the total device area 28.

The position and extent of the depleted well region 64 may vary from the example shown in FIG. 1. For instance, the depleted well region may have a lesser vertical extent. In one example, the depleted well region 64 extends downward from a depth that corresponds with a bottom surface of the STI region 42. The depleted well region 64 may thus not reach the substrate surface or the level at which charge carriers are accumulating under the gate. The depleted well region 64 may thus be adjacent to or spaced from the accumulation region 58. The depleted well region 64 may accordingly be a buried well region or be otherwise vertically spaced from the surface 40.

The positioning of the interface between the drift region 50 and the depleted well region 64 may also vary. For instance, the depleted well region 64 may extend farther inward (e.g., under the STI region 42) than in the example shown in FIG. 1. The depleted well region 64 may thus laterally overlap the buried well region 60. The implant that forms the drift region 50 may extend laterally outward into the area in which the accumulation region 58 is formed. The outer perimeter of the layout that forms the drift region 50 thus need not be aligned with an edge or sidewall of the STI regions 42 (as shown in FIG. 1). For example, the implant that forms the drift region 50 may not laterally reach the STI region edge. As the outer lateral boundary of the implant for the drift region 50 retreats from the STI edge (and, thus, the accumulation region), more of the drain bias voltage is disposed across the depleted well region 64, thereby increasing the differential between the drain and isolation bias voltages. The voltage drop provided by the depletion region 62 may thus be adjusted by moving the lateral position of the implant that forms the drift region 50 relative to the STI region 42.

The voltage drop may also be adjusted by modifying the location of the buried well region 60. For example, the lateral and/or vertical extent of the buried well region 60 may be modified to change the size and/or extent (e.g., vertical extent) of the gap between the body region 48 and the buried well region 60. As the size and/or extent of the gap increases, the breakdown voltage of the device 20 is improved because more voltage drop is observed across the depleted well region 64.

The lateral extent of the depleted well region 64 may also vary in other ways, such as along the outer boundary of the depleted well region 64. The lateral overlap of the body region 48 and the depleted well region 64 may be present to accommodate a minimal opening width of a pre-existing implantation procedure used to form the depleted well region 64. In other cases, the lateral overlap may be reduced considerably (e.g., to a point at which the depleted well region 64 is or nearly aligned, i.e., line-on-line, with the body region 48). Thus, the extent to which the depleted well region 64 laterally extends under the body region 48 may vary. In some cases, the body region 48 and the depleted well region 64 do not laterally overlap.

In some cases, the drift region 50 and the depleted well region 64 constitute contiguous or other portions of a single well in the epitaxial layer 24 of the substrate 22. An example of this arrangement is shown and described in connection with FIG. 2. Other contiguous and non-contiguous arrangements of the drift region 50 and the depleted well region 64 may be used. For example, the depleted well region 66 may be laterally adjacent to additional and/or alternative regions or layers of the depletion region 62. In some cases, the depletion region 62 includes one or more buried wells disposed between the drift region 50 and the depleted well region 64.

Figure 2:
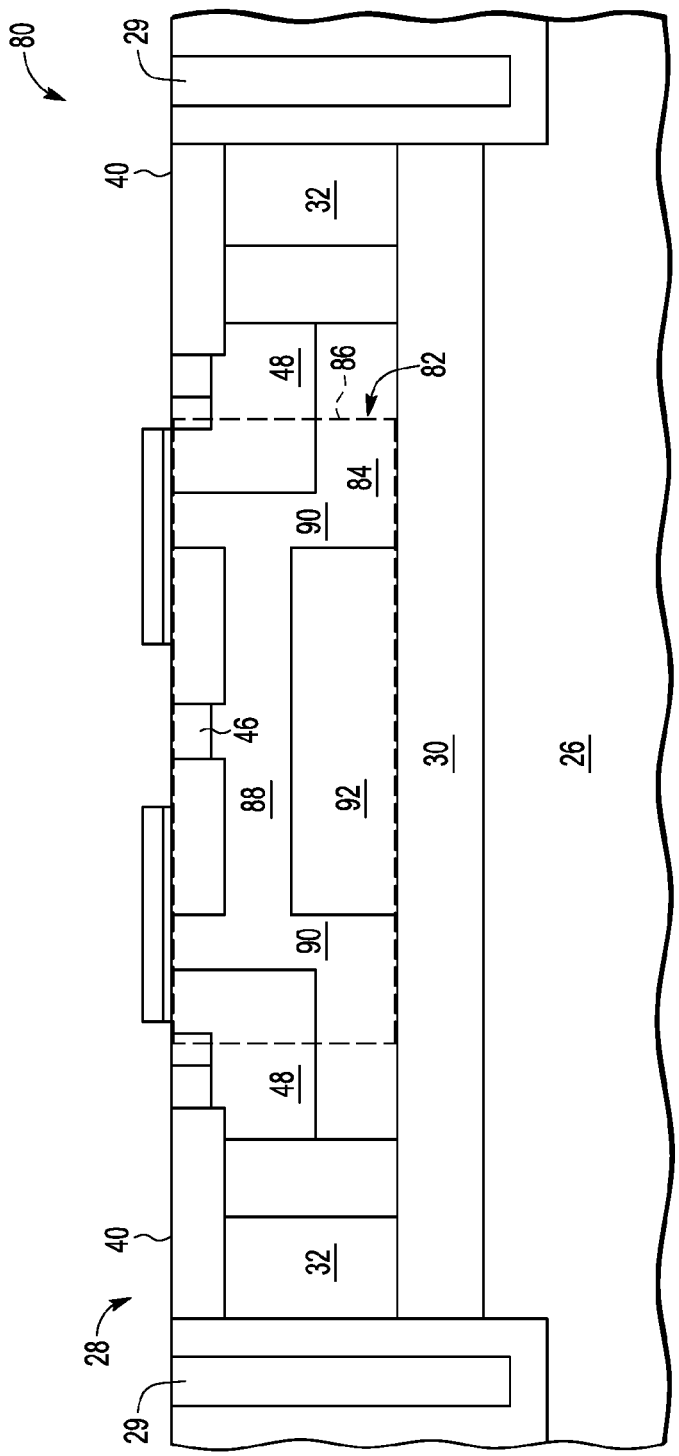
FIG. 2 is a cross-sectional, schematic view of another exemplary n-channel LDMOS transistor with self-biased isolation in accordance with one embodiment.

FIG. 2 depicts a device 80 having partially biased isolation in accordance with one embodiment. The device 80 is configured similarly in many respects to the examples described above in connection with FIG. 1. For instance, the device 80 has a device area 28 defined by DTI region 29 and a doped isolation barrier having buried isolation layer 30 and one or more isolation wells 32. All of the regions and structures within the core device area of the device 80 may be disposed, arranged, and otherwise configured as described above in connection with FIG. 1, except as noted below. Unless noted otherwise, the structures, components, and other elements of the device 80 may be configured as described above in connection with FIG. 1.

The device 80 differs from the above-described examples in the configuration of a depletion region 82. In this case, the depletion region 82 includes a single well region 84 rather than multiple constituent wells or other regions. With a single well, the various portions or sections of the well region 84 have the same dopant concentration profile. The well region 84 may be formed via one or more implants configured for doping across an area 86. In the symmetrical example of FIG. 2, the area 86 may be centered within the core device area of the device 80. Along its outer border, the area 86 may laterally overlap the body region 48 to any desired extent. The vertical and lateral extent of the well region 84 and the area 86 may vary as described above in connection with the example of FIG. 1.

The well region 84 establishes a drift region 88 and a link region 90. The functions of the drift region 88 and the link region 90 may be similar to the corresponding regions described above in connection with the example of FIG. 1. For instance, the link region 90 is in contact with the buried doped isolation layer 30 to establish the electrical link with the drain region 46.

The well region 84 may be depleted in a manner similar to the above-described examples. For instance, both the drift and link regions 88, 90 may be depleted by the body region 48 and a buried well region 92. The buried well region 92 is floating as described above. The buried well region 92 may be formed via one or more implants of an opposite conductivity type (e.g., p-type) than the conductivity type of the depleted well region 84. The buried well region 92 may be in contact with the buried doped isolation layer 30 as shown, or be spaced therefrom as described above. The spacing and/or dopant conductivity levels of the regions 84, 92 may be selected to reduce the possibility of punch through and/or other breakdown.

The above-described devices are shown in simplified form. FIGS. 1 and 2 do not depict an Ohmic metal layer (e.g., a metal-one layer) used to form various electrodes. FIGS. 1 and 2 also do not show a number of other metal layers configured for interconnections with the electrodes. The devices may have a number of other structures or components for connectivity, isolation, passivation, and other purposes not shown in FIGS. 1 and 2 for ease in illustration. For instance, the devices may include a number of additional backside layers.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
| --- | --- | --- |
| p-epi 24: | $1 \times 10^{13}$-$1 \times 10^{16}$/cm$^3$ | 2-10 μm |
| substrate 26: | $1 \times 10^{15}$-$1 \times 10^{18}$/cm$^3$ | not applicable |
| buried layer 30: | $1 \times 10^{16}$-$5 \times 10^{19}$/cm$^3$ | 0.5-3.5 μm |
| well 32: | $1 \times 10^{16}$-$1 \times 10^{19}$/cm$^3$ | 1-5 μm |
| body 48: | $1 \times 10^{16}$-$1 \times 10^{19}$/cm$^3$ | 0.5-5 μm |
| source 44: | $1 \times 10^{20}$-$1 \times 10^{23}$/cm$^3$ | 0.1-0.5 μm |
| drain 46: | $1 \times 10^{20}$-$1 \times 10^{23}$/cm$^3$ | 0.1-0.5 μm |
| drift 50: | $1 \times 10^{15}$-$1 \times 10^{18}$/cm$^3$ | 0.2-3 μm |
| buried 60: | $1 \times 10^{15}$-$1 \times 10^{18}$/cm$^3$ | 0.2-3 μm |
| depleted 64: | $1 \times 10^{15}$-$1 \times 10^{18}$/cm$^3$ | 1-5 μm |

The concentrations and thicknesses may be different in other embodiments. For example, the dopant concentration of the bulk substrate 26 may vary considerably.

Various symmetrical and asymmetrical layouts may be used for the devices 20, 80 of FIGS. 1 and 2. For example, the gate structures may be U-shaped or arch-shaped (e.g., a single lateral connection) or toroidal or looped (e.g., two lateral connections) or rectangular (e.g., connected by metal line(s) from one or both ends) when viewed from above. In such cases, the source/body regions of the devices 20, 80 may nonetheless be considered central or centered despite the lack of symmetry in the other lateral dimension. The devices 20, 80 may thus be laterally symmetrical in zero, one or both lateral dimensions. The layouts of the above-described regions of the devices 20, 80 may vary considerably from these examples.

The layout of the devices 20, 80 may differ from the examples shown in other ways. For example, each gate structure 54 may be or include two spaced apart structures. The first structure is positioned above the body region 48 to establish the channel region 56 and the accumulation region 58, while the second structure may be positioned above the STI region 42. The periphery of the second structure may be laterally spaced inward from the edges of the STI region 42. The two structures may be biased at the same gate potential or different gate potentials.

Figure 3:
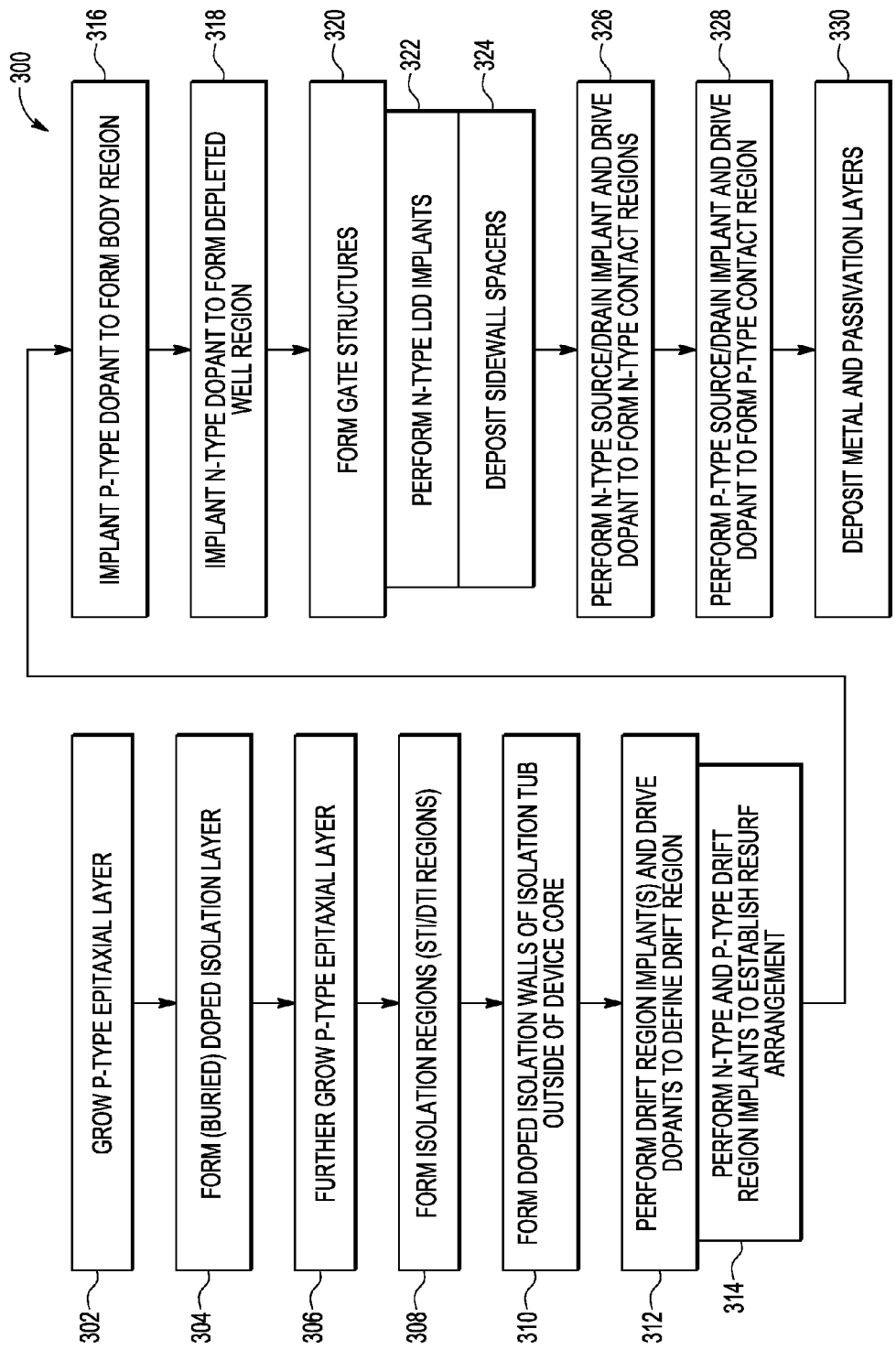
FIG. 3 is a flow diagram of an exemplary fabrication sequence to construct n-channel LDMOS transistors having self-biased isolation in accordance with one embodiment.

FIG. 3 shows an exemplary method 300 for fabricating one or more of the above-described devices. In this example, the method 300 is configured to fabricate an n-channel device. The device may be an LDMOS device having a RESURF configuration and one or more of the above-described features directed to partially biasing a doped isolation barrier. The devices are fabricated with a p-type bulk semiconductor substrate, the regions or layers of which may have the conductivity types of the n-channel examples described above, or be alternatively fabricated with an n-type substrate. The method includes a sequence of acts, only the salient of which are depicted for convenience in illustration.

The ordering of the acts may vary in other embodiments. For example, an act directed to forming isolation wells may be implemented after one or more acts configured to form the regions located within a core device area.

The method 300 may begin with one or more acts directed to the growth or other formation of one or more epitaxial layers. In this example, a p-type epitaxial layer is grown on a p-type bulk substrate in an act 302. In some cases, e.g., where the p-type bulk substrate is lightly doped, the act 302 may be optional, e.g., in the interest of reducing process costs. During or after the formation of the epitaxial layer, a doped isolation layer is formed in an act 304. The act 304 may include a dopant implantation or other doping technique. In other cases, the isolation layer is formed before the growth of an epitaxial layer. In some cases, the method 300 then includes growth (e.g., further growth) of a p-type epitaxial layer in an act 306. As a result, the doped isolation layer becomes a buried doped isolation layer.

The lower biasing of the isolation regions of the device as described herein may allow the thickness of the epitaxial layer(s) to be minimized or reduced. The method 300 may accordingly include only a single epitaxial layer. In such cases, the act 304 may be implemented before or during formation of the single epitaxial layer.

In the example of FIG. 3, a number of STI regions and DTI structures are formed in an act 308. The STI regions may be used to define and separate active areas within and outside of the core device area. One or more STI regions may also be used to space a drain region from a gate structure in a field drift arrangement, as described above. The DTI structures may be ring-shaped to define a device area for the device. In some cases, the act 308 is implemented after implementation of one or more of the implantation procedures described below.

The STI regions and DTI structures may be formed via any now known or hereafter developed procedure. In some cases, the act 308 may include the formation of a trench and the deposition (e.g., chemical vapor deposition, or CVD) of one or more materials in the trench. In some embodiments, the trench is filled with silicon oxide. Additional or alternative materials may be deposited.

In an act 310, an implantation is performed to form a region of a doped isolation barrier. The region may be a well region disposed along a sidewall of the doped isolation barrier. The implantation may be configured to form one or more isolation wells, which may be vertically stacked upon one another to define the sidewall. The isolation wells may be positioned to extend upward from the buried doped isolation layer such that doped isolation barrier is shaped as an isolation tub. The isolation wells may be disposed at and along the DTI structure, as described above. The act 310 may be performed at various points in the fabrication procedure.

One or more dopant implantations are performed in an act 312 to form one or more well regions. A number of regions of the n-channel device may be formed. Each implantation may be configured to form a ring-shaped well region or multiple well regions. In some cases, the well region may perform multiple functions, as described above. For instance, the implantation of act 312 is configured such that well region has a portion configured as a drift region and a portion configured as a depleted well region disposed between a region (e.g., an isolation well region) of the doped isolation barrier and the drift region.

In the example of FIG. 3, the act 312 includes performing both n-type and p-type implantations in an act 314. The n-type implantation is configured to form a drift region. In other cases, the implantation is configured to form both a drift region and a depleted well region as portions of a single well, as described above. The depleted well region is (or includes) the portion of the single well that establishes the electrical link between the drain region and the buried doped isolation layer. The electrical link supports the partial biasing of the doped isolation barrier, as described above.

The p-type implantation of the act 314 may be directed to forming the buried well region(s) used to deplete the drift region and the depleted well region. The p-type implantation may be configured such that the buried well region(s) are in contact with the drift region and the depleted well region. The buried well region adjacent the drift region acts as a RESURF region. In some cases, the n-type and p-type implantations of the act 314 use the same mask.

Further p-type and n-type implantation procedures are performed in acts 316, 318 to form the body and depleted well regions, respectively. The implantations are configured to position the regions for depletion of the depleted well region as described above. The order in which these and other implantation procedures are implemented may vary from the order shown in FIG. 3.

The implantation of act 318 is configured such that the depleted well region establishes an electrical link between the buried doped isolation layer and the drain region such that the buried doped isolation layer is biased at a voltage level lower than the voltage applied to the drain region. To that end, the implantation of the act 318 is configured as a deep implant such that the depleted well region reaches a depth in the semiconductor substrate to be in contact with the buried doped isolation layer. The extent to which the depleted well region is at or near the surface of the substrate may vary as described above. The implantations of acts 314, 318 may be configured such that the buried well region is disposed laterally adjacent to, and in contact with, the depleted well region to deplete the depleted well region.

The implantation of act 318 may be a lightly doped implant to support the depletion of the depleted well region. The dopant concentration level of the depleted well region may fall in a range from about $1 \times 10^{15}$-$1 \times 10^{18}$/cm$^3$. In one example, the dopant concentration level of the depleted well region is about $1 \times 10^{16}$/cm$^3$. The depleted well region may have a lower or comparable dopant concentration level than both the drift region and the buried doped isolation layer. Dopant concentration levels in this range are useful because the implantation may be heavy enough to surpass the level of the epitaxial layer but still low enough to promote depletion.

The areas into which dopant is implanted during the above-described acts may overlap. For example, the dopant implantation areas established via the respective layout masks for acts 312 and 318 may overlap. The lateral positioning of the effective interface between the drift region and the depleted well region may vary accordingly. The implantation areas for acts 316 and 318 may also overlap to a varying extent, as described above.

In some cases, the implantation of act 318 is a pre-existing implantation procedure. For example, the implantation may be configured to also form a drift region of another FET device formed in the semiconductor substrate. The partial, self-biasing of the doped isolation barrier may thus be achieved without added fabrication costs.

The fabrication process may then include one or more procedures collectively shown in act 320. The procedures may be implemented in various orders. Additional or alternative procedures may be implemented. One or more components of gate and conductive flap structures may be initially formed. For instance, a gate dielectric layer and conductive plate may be deposited and patterned to form the gate and flap structures. A number of implantations may then be performed in an act 322 to form one or more LDD regions, e.g., adjacent the gate structure. After the dopant for the LDD regions is implanted, sidewall spacers may then be deposited along each gate structure in an act 324. The sidewall spacers and/or other components of the gate structure may then be used for self-alignment of a source region.

In acts 326 and 328, n-type and p-type source/drain implantations are performed to form the various n-type and p-type contact regions of the device, respectively. Source and drain regions may thus be formed. The p-type body contact region of the n-channel device is also formed.

A number of metal and passivation layers may then be deposited on the substrate in an act 332. The metal layers may be patterned to form Ohmic contacts and electrodes, metal flap structures, and various interconnects, including interconnects to bias the conductive flap structure as described above.

Additional, fewer, or alternative acts may be implemented. For example, any number of epitaxial layers may be grown on the original, bulk substrate. A number of acts are optional, including, for instance, acts related to elements or aspects of a gate structure or the channel, such as the formation of sidewall spacers and LDD regions.

Transistor devices having a controllable depletion region (e.g., depleted well region) are described above. The depletion region provides a soft electrical connection (rather than a hardwired connection) between the drain bias voltage and the isolation regions of the device. The voltage drop across the depletion region provides a self-adjusted differential potential for the isolation regions. The lower voltage on the isolation regions improves the vertical junction breakdown limit for the device by, for instance, relaxing the vertical electrical field stress within the core device area (e.g., under the device body). The RESURF effect (e.g., double RESURF effect) may thus be utilized to attain higher breakdown voltage levels (e.g., BVdss levels) without sacrifices in device size. For example, an increase in the thickness of the epitaxial layer(s) may be avoided as a result of the lower biasing of the isolation regions. Improvements in both high-side and low-side operation are realized.

Although described in connection with n-channel LDMOS transistors, the disclosed devices are not limited to any particular transistor configuration. The partial isolation biasing of the disclosed devices may be useful in a wide variety of power electronic devices. For instance, application of the features of the disclosed devices is not limited to LDMOS or other power MOS devices. The partial isolation biasing is also not limited to any one particular type of RESURF configuration. The disclosed devices may have varying RESURF structures, including single, double, or other RESURF structural arrangements, each of which may be referred to herein as a "RESURF transistor."

For convenience of description and without any intended limitation, n-channel LDMOS devices with a p-type substrate are described and illustrated. However, the disclosed devices are not limited to p-type substrates, such that other types of devices may be provided by, for example, substitution of semiconductor regions of opposite conductivity type. Thus, for example, each semiconductor region, layer or other structure in the example described in connection with FIGS. 1 and 2 may have a conductivity type (e.g., n-type or p-type) opposite to the type identified in the examples below.

In a first aspect, a device includes a semiconductor substrate, a buried doped isolation layer disposed in the semiconductor substrate to isolate the device, a drain region disposed in the semiconductor substrate and to which a voltage is applied during operation, and a depletion region disposed in the semiconductor substrate and having a conductivity type in common with the buried doped isolation barrier and the drain region, the depletion region reaching a depth in the semiconductor substrate to be in contact with the buried doped isolation layer. The depletion region establishes an electrical link between the buried doped isolation layer and the drain region such that the buried doped isolation layer is biased at a voltage level lower than the voltage applied to the drain region.

In a second aspect, a device includes a semiconductor substrate, a doped isolation barrier disposed in the semiconductor substrate, having a first conductivity type, and including a buried doped isolation layer, a body region disposed in the semiconductor substrate, having a second conductivity type, and in which a channel is formed during operation, a drift region disposed in the semiconductor substrate within the device area, having the first conductivity type, and through which charge carriers drift during operation after exiting the channel, a drain region disposed within the drift region, having the first conductivity type, and to which a voltage is applied during operation, and a depleted well region having the first conductivity type and positioned between, and in contact with, the drift region and the buried doped isolation layer. The depleted well region establishes an electrical link between the buried doped isolation layer and the drain region, and the doped isolation barrier and the drain region are not electrically tied to one another.

In a third aspect, a method of fabricating a transistor in a semiconductor substrate includes forming a buried doped isolation layer of the transistor, performing a first implantation to form a drift region of the transistor, performing a second implantation to form a depleted well region of the transistor, and performing a third implantation to form a drain region to which a voltage is applied during operation, the first, second, and third implantations configured to implant dopant of a common conductivity type. The second implantation is configured such that the depleted well region reaches a depth in the semiconductor substrate to be in contact with the buried doped isolation layer. The second implantation is configured such that the depleted well region establishes an electrical link between the buried doped isolation layer and the drain region such that the buried doped isolation layer is biased at a voltage level lower than the voltage applied to the drain region.

References to a well region or other doped region of a semiconductor having a certain conductivity type are intended to specify that the region has a net dopant concentration of the type indicated to support the indicated conductivity type. The region may have dopant of the other conductivity type therein, but the amount of such opposite dopant is insufficient to change the effective, or net, conductivity type of the region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
   a semiconductor substrate;
   a buried doped isolation layer disposed in the semiconductor substrate to isolate the device;
   a drain region disposed in the semiconductor substrate and to which a voltage is applied during operation; and
   a depletion region disposed in the semiconductor substrate and having a conductivity type in common with the buried doped isolation layer and the drain region, the depletion region reaching a depth in the semiconductor substrate to be in contact with the buried doped isolation layer;

wherein the depletion region establishes an electrical link between the buried doped isolation layer and the drain region such that the buried doped isolation layer is biased at a voltage level lower than the voltage applied to the drain region.

2. The device of claim 1, wherein the depletion region comprises:
a drift region within which the drain region is disposed, and through which charge carriers drift during operation to reach the drain region; and
a depleted well region positioned between, and in contact with, the drift region and the buried doped isolation layer.

3. The device of claim 2, further comprising a buried well region disposed in the semiconductor substrate under and in contact with the drift region, wherein the buried well region is in contact with the depleted well region, and has an opposite conductivity type than the drift region and the depleted well region to deplete the drift region and the depleted well region.

4. The device of claim 3, wherein the buried well region is a floating region having a layout that matches a layout of the drift region.

5. The device of claim 3, wherein the buried well region is laterally surrounded by the depleted well region, and spaced from the buried doped isolation layer by a portion of the semiconductor substrate having the opposite conductivity type and a dopant concentration level lower than the buried well region.

6. The device of claim 2, wherein the depleted well region has a lower dopant concentration level than the drift region.

7. The device of claim 2, further comprising:
a gate structure supported by the semiconductor substrate; and
a body region in the semiconductor substrate and in which a channel is formed during operation under the gate structure;
wherein the gate structure defines an accumulation region in the semiconductor substrate in which charge carriers accumulate adjacent the channel during operation, and
wherein the depleted well region is disposed in the accumulation region.

8. The device of claim 7, wherein the depleted well region laterally extends under the body region to laterally overlap the body region.

9. The device of claim 7, further comprising an isolation region under which the drift region is disposed, wherein the depleted well region is laterally adjacent to or laterally overlaps the isolation region.

10. The device of claim 2, wherein the drift region has a dopant concentration profile in common with the depleted well region.

11. The device of claim 1, wherein the depletion region extends from a surface of the semiconductor substrate.

12. The device of claim 1, wherein the depletion region is fully depleted.

13. The device of claim 1, wherein the depletion region is partially depleted.

14. The device of claim 1, further comprising a doped isolation barrier in the semiconductor substrate, wherein:
the doped isolation barrier comprises the buried doped isolation layer and a ring-shaped well;
the ring-shaped well is disposed along a device periphery;
the ring-shaped well is electrically coupled with the buried doped isolation layer; and
the doped isolation barrier and the drain region are not electrically tied to one another.

15. A device comprising:
a semiconductor substrate;
a doped isolation barrier disposed in the semiconductor substrate, having a first conductivity type, and comprising a buried doped isolation layer;
a body region disposed in the semiconductor substrate, having a second conductivity type, and in which a channel is formed during operation;
a drift region disposed in the semiconductor substrate within the device area, having the first conductivity type, and through which charge carriers drift during operation after exiting the channel;
a drain region disposed within the drift region, having the first conductivity type, and to which a voltage is applied during operation; and
a depleted well region having the first conductivity type and positioned between, and in contact with, the drift region and the buried doped isolation layer;
wherein the depleted well region establishes an electrical link between the buried doped isolation layer and the drain region, and
wherein the doped isolation barrier and the drain region are not electrically tied to one another.

16. The device of claim 15, further comprising a floating buried well region having the second conductivity type, wherein:
the floating buried well region is disposed in the semiconductor substrate under and in contact with the drift region;
the floating buried well region is laterally adjacent to, and in contact with, the depleted well region;
the depleted well region comprises a fully depleted section disposed between the body region and the floating buried well region; and
the fully depleted section establishes the electrical link.

17. The device of claim 15, wherein the depleted well region has a lower dopant concentration level than the drift region.

18. A method of fabricating a transistor in a semiconductor substrate, the method comprising:
forming a buried doped isolation layer of the transistor;
performing a first implantation to form a drift region of the transistor;
performing a second implantation to form a depleted well region of the transistor; and
performing a third implantation to form a drain region to which a voltage is applied during operation, the first, second, and third implantations configured to implant dopant of a common conductivity type;
wherein the second implantation is configured such that the depleted well region reaches a depth in the semiconductor substrate to be in contact with the buried doped isolation layer;
wherein the second implantation is configured such that the depleted well region establishes an electrical link between the buried doped isolation layer and the drain region such that the buried doped isolation layer is biased at a voltage level lower than the voltage applied to the drain region.

19. The method of claim 18, further comprising performing a fourth implantation to form a buried well region having an opposite conductivity type than the common conductivity type, wherein the second and fourth implantations are configured such that the buried well region is disposed laterally adjacent to, and in contact with, the depleted well region to deplete the depleted well region.

20. The method of claim 18, wherein the second implantation is configured to form a drift region of a field effect transistor device formed in the semiconductor substrate.

* * * * *